(12) United States Patent
Okamoto

(10) Patent No.: US 6,313,458 B1
(45) Date of Patent: Nov. 6, 2001

(54) GAIN-ADJUSTABLE PHOTORECEIVER CIRCUIT WITH PHOTOELECTRIC CONVERTER AND AMPLIFIER

(75) Inventor: Fuyuki Okamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/349,766

(22) Filed: Jul. 9, 1999

(30) Foreign Application Priority Data

Jul. 10, 1998 (JP) .................................................. 10-195771

(51) Int. Cl.$^7$ .............................. H01J 40/14; H03G 3/10
(52) U.S. Cl. ........................................ 250/214 A; 330/308
(58) Field of Search .................................... 330/308, 110, 330/86; 327/514; 250/214 AG, 214 A, 214 R

(56) References Cited

U.S. PATENT DOCUMENTS

| | | | |
|---|---|---|---|
| 4,013,975 | * 3/1977 | Kataoka et al. | 330/145 |
| 5,015,839 | * 5/1991 | Tanikoshi | 250/214 AG |
| 5,376,813 | 12/1994 | Delbruck et al. | 257/288 |
| 5,786,730 | * 7/1998 | Hadley | 330/59 |

FOREIGN PATENT DOCUMENTS

| | | |
|---|---|---|
| 4-225611 | 8/1992 | (JP) . |
| 4367108 | 12/1992 | (JP) . |
| 4367109 | 12/1992 | (JP) . |
| 5259772 | 10/1993 | (JP) . |
| 6-45682 | 2/1994 | (JP) . |
| 846444 | 2/1996 | (JP) . |
| 8172332 | 7/1996 | (JP) . |
| 9130157 | 5/1997 | (JP) . |
| 9246887 | 9/1997 | (JP) . |
| 9-260712 | 10/1997 | (JP) . |
| 10107555 | 4/1998 | (JP) . |

OTHER PUBLICATIONS

Carver Mead, *"Analog VLSI and Neutral Systems"*, Addison–Wesley Publishing Company, pp. 90–93 and 67–68. Publ. date Aug. 1989.

* cited by examiner

*Primary Examiner*—Seungsook Ham
*Assistant Examiner*—Eric Spears
(74) *Attorney, Agent, or Firm*—Young & Thompson

(57) ABSTRACT

A photoreceiver circuit includes (a) a photoelectric conversion element for converting incident light to a current, (b) an analog voltage amplifier circuit for amplifying a voltage corresponding to the current of the photoelectric conversion element and for producing an amplified voltage as an output of the photoreceiver circuit, and (c) an analog multiplier circuit for multiplying the amplified voltage produced by the voltage amplifier circuit by an adjusting voltage and for producing an output current with a component proportional to a product of the amplified voltage and the adjusting voltage. The output current of the analog multiplier circuit is supplied to the photoelectric converter element, thereby forming a feedback path of the voltage amplifier circuit. A voltage-lowering part and a current-leaking part may be additionally provided. The voltage-lowering part is connected between the voltage amplifier and the analog multiplier circuit, and the current-leaking part is connected in parallel to the voltage-lowering part.

6 Claims, 6 Drawing Sheets

US 6,313,458 B1

GAIN-ADJUSTABLE PHOTORECEIVER CIRCUIT WITH PHOTOELECTRIC CONVERTER AND AMPLIFIER

BACKGROUND OF THE INVENTION

1. Field of the Invention

The present invention relates to a photoreceiver circuit and more particularly, to a photoreceiver or photoreceptor circuit equipped with a photoelectric conversion element and an amplifier circuit, which is capable of conversion-gain adjustment of the photoelectric conversion element and high-speed circuit operation. For example, this photoreceiver circuit is applicable to intelligent sensors for sensing a moving object or objects in an image formed by a photoelectric conversion element (i.e., a scene).

2. Description of the Prior Art

An example of the prior-art photoreceiver or photoreceptor circuits each having photoelectric conversion elements and amplifier circuits is disclosed in the U.S. Pat. No. 5,376,813 issued on Dec. 27, 1994, which is intended to expand the dynamic range with respect to the incident light, resulting in increase in response speed. The circuit configuration of this prior-art photoreceiver circuit thus patented is shown in FIG. 1.

In FIG. 1, a photodiode 301 serves as a photoelectric conversion element. One terminal of the photodiode 301 is connected to the gate of an n-channel Metal-Oxide-Semiconductor Field-Effect Transistor (MOSFET) 302. The other terminal of the photodiode 301 is connected to the ground. The source of the MOSFET 302 is connected to the ground. The drain of the MOSFET 302 is connected to the drain of a p-channel MOSFET 303. The source of the MOSFET 303 is connected to a power supply (not shown) supplying a constant supply voltage $V_{cc}$. The gate of the MOSFET 303 is applied with a suitable bias voltage $V_{bias}$.

The combination of the MOSFETs 302 and 303 serves as an inverting, analog voltage amplifier circuit 310 for amplifying a voltage $V_a$ at the output terminal 300A of the photodiode 301 with respect to the ground (i.e., an input voltage $V_{in}$ of the amplifier 310). The MOSFET 302 is operated in the saturation region. The MOSFET 303 serves as a load resistor of the MOSFET 302 in the amplifier circuit 310.

An output voltage $V_{out}$ of the voltage amplifier circuit 310, which is an amplified voltage of the input voltage $V_{in}$, is derived from the drain of the MOSEET 302 or an output terminal 300B. The output voltage $V_{out}$ is fed back to the input side of the amplifier circuit 310 through a voltage-lowering circuit 330 and an n-channel MOSFET 307. The voltage-lowering circuit 330 comprises two capacitors 304 and 305. The capacitor 304, which as a capacitance $C_1$, is connected to the output terminal 300B and a terminal 300D connected to the gate of the MOSFET 307. The capacitor 305, which has a capacitance $C_2$, is connected to the terminal 300D and the ground.

A current-leaking circuit 320, which comprises a p-channel MOSFET 306, is connected in parallel to the voltage-lowering circuit 330 between the terminals 300B and 300D. The gate and the drain of the MOSFET 306 are coupled together to be connected to the terminal 300B. The source of the MOSFET 306, which is connected to the substrate, is connected to the terminal 300D.

The source of the MOSFET 307 is connected to the terminal of the photodiode 301 at the terminal 300A. The drain of the MOSFET 307 is connected to the power supply and applied with the supply voltage $V_{cc}$.

The current leaking circuit 320 serves to leak a current between the terminals 300B and 300D. Specifically, when a potential difference occurs between the terminals 300B and 300D, a current flows gradually (i.e., leaks) through the MOSFET 306 from the terminal 300B to the terminal 300D and vice versa, thereby eliminating the potential difference after a specific relaxation time.

Next, the operation of the prior-art photoreceiver circuit shown in FIG. 1 is explained below.

When the incident light PH applied to the photodiode 301 has a constant intensity with time, i.e., the photodiode 301 is in the steady state, the electric potentials or voltages at the terminals 300B and 300D with respect to the ground are equal to each other because of the current-leaking operation of the MOSFET 306. On the other hand, a voltage $V_d$ at the terminal 300D (i.e., the gate voltage of the MOSFET 307) with respect to the ground is determined in such a way that a current flowing through the MOSFET 307 is equal to an output current $I_{PH}$ of the photodiode 301.

Thus, the output voltage $V_{out}$ of the prior-art photoreceiver circuit of FIG. 1 produced at the output terminal 300B is equal to the voltage $V_d$ at the terminal 300D, i.e., $V_{out}=V_d$, when the photodiode 301 is in the steady state.

On the other hand, when the intensity of the incident light PH applied to the photodiode 301 varies with time, i.e, the photodiode 301 is in the changing state, the magnitude of the output current $I_{PH}$ of the photodiode 301 varies with time according to the intensity change of the light PH, thereby changing the magnitude of the voltage $V_a$ at the terminal 300A. The change of the voltage $V_a$ at the terminal 300A is applied to the amplifier circuit 310 as its input voltage $V_{in}$ and is amplified therein, producing an amplified change of the output voltage $V_{out}$ at the terminal 300B. This amplified change of $V_{out}$ is opposite in phase to the change of $V_a$ and therefore, the latter is decreased if the former is increased, and vice versa. The amplified change of the output voltage $V_{out}$ is sent to the gate of the MOSFET 307 through the voltage-lowering circuit 330, causing an amplified change of the current flowing through the MOSFET 307. Thus, the current flowing through the MOSFET 307 is equalized with the output current $I_{PH}$ of the photodiode 301.

As explained above, the output voltage $V_{out}$ of the photoreceiver circuit is fed back to the input side of the amplifier circuit 310 through the voltage-lowering circuit 330 and the n-channel MOSFETs 307, thereby suppressing the change of the voltage $V_a$ at the terminal 300A caused by the change of the output current $I_{PH}$. As a result, the value of the voltage $V_a$ is kept approximately constant independent of the intensity change of the incident light PH.

The above-described circuit operation of the prior-art photoreceiver circuit of FIG. 1 is unlike that of another prior-art photoreceiver circuit shown in FIG. 2. The circuit in FIG. 2 is simply comprised of a photodiode 401 and an n-channel MOSFET 402 without any feedback path. An output terminal 400A of the photodiode 401 is connected to the source of the MOSFET 402. The gate of the MOSFET 401 is applied with a fixed bias voltage $V_b$. An output voltage $V_{out}$ of the photoreceiver circuit is derived from the output terminal 400A.

In the circuit of FIG. 2, since no feedback path is provided, the output voltage $V_{out}$ produced at the terminal 400A varies largely in order to equalize the current flowing through the MOSFET 402 with the output current $I_{PH}$ of the photodiode 401. This is quite different from that of the prior-art photoreceiver circuit shown in FIG. 1 where the current flowing through the MOSFET 307 is equalized with the output current $I_{PH}$ of the photodiode 301 by changing the gate voltage $V_d$ of the MOSFET 307.

In the circuit of FIG. 2, the parasitic capacitors existing in the vicinity of the terminal 400A (e.g., the parasitic capacitors of the photodiode 401 and the source region of the MOSFET 402) need to be charged and discharged by the output current $I_{PH}$ itself of the photodiode 401. Since the output current $I_{PH}$ is usually very small, it takes a long time to fully charge or discharge these parasitic capacitors. This means that the necessitated relaxation time of the photoreceiver circuit of FIG. 2 from the changing state to the steady state is extremely long.

In contrast, in the photoreceiver circuit of FIG. 1, the voltage $V_a$ at the terminal 300A is always kept approximately constant because of the operation of the MOSFET 307. Thus, the parasitic capacitances need not be charged nor discharged, which shortens the relaxation time. This creates an advantage of high-speed circuit operation.

In addition to the advantage of high-speed circuit operation, the prior-art photoreceiver circuit of FIG. 1 has another advantage that the gain of the photoreceiver circuit in the changing state is different from that in the steady state. Here, the term "gain" means the coefficient of photoelectric conversion in this photoreceiver circuit, in other words, it means the ratio of the magnitude of the output voltage $V_{out}$ to the intensity of the incident light PH. Because of this variable gain, the prior-art photoreceiver circuit of FIG. 1 has a wider dynamic range than that of the prior-art photoreceiver circuit of FIG. 2.

Subsequently, adjustment of the gain in the photoreceiver circuit of FIG. 1 is explained below.

As explained previously, the p-channel MOSFET 306 of the current-leaking circuit 320 has a function to leak the current between the terminals 300B and 300D. Thus, if the intensity of the incident light PH varies abruptly and therefore, the output voltage $V_{out}$ generated at the terminal 300B is abruptly changed, the voltage change at the terminal 300B is transmitted to the terminal 300D through the capacitors 304 and 305 of the voltage-lowering circuit 330. In this case, the voltage $V_d$ at the terminal 300D is equal to $[C_1/(C_1+C_2)]$ times the output voltage $V_{out}$ because it is divided by the capacitors 304 and 305, where $V_d<V_{out}$. As a result, to equalize the current flowing through the MOSFET 307 with the output current IPH of the photodiode 401, the output voltage $V_{out}$ at the terminal 300B needs to be higher than a voltage required in the steady state. This means that the gain of the photoreceiver circuit of FIG. 1 in Lhe changing state is higher than that in the steady state.

However, the state where the voltage $V_d$ at the terminal 300D is equal to $[C_1/(C_1+C_2)]$ $V_{out}$ occurs only in the changing state where the intensity of the incident light PH varies. After the intensity change of the light PH disappears and the circuit operation enters the steady state, the MOSFET 306 allows the current to leak from the terminal 300B to the terminal 300D and vice versa, resulting in the output voltage $V_{out}$ at the terminal 300B being equal to the voltage $V_d$ at the terminal 300D.

In other words, in the changing state, the feedback loop is constituted by the capacitors 304 and 305 and the MOSFET 307 and therefore, the divided voltage $V_d$ is applied to the gate of the MOSFET 307. Unlike this, in the steady state, the feedback loop is constituted by the p-channel MOSFET 306 and the MOSFET 307 and therefore, the output voltage $V_{out}$ at the terminal 300B is directly fed back to the gate of the MOSFET 307.

As explained above, in the prior-art photoreceiver circuit of FIG. 1, the value of the photoelectric-conversion gain in the changing state is $[(C_1+C_2)/C_1]$ times as much as that in the steady state, resulting in a wider dynamic range than that in the circuit of FIG. 2.

With the prior-art photoreceiver circuit of FIG. 1, however, there is a problem that the gain value of the photoreceiver circuit is unable to be optionally adjusted from the outside. This problem occurs not only in the changing state where the intensity of the incident light PH varies (i.e., the capacitors 304 and 305 constitute the feedback path) but also in the steady state where the intensity of the light PH does not vary (i.e., the MOSFET 306 constitutes the feedback path).

The above problem is caused by the difficulty in gain adjustment of the analog voltage amplifier circuit 310. The adjustment of the gain of the amplifier circuit 310 can be realized only by changing the value of the bias voltage $V_{bias}$ applied to the gate of the MOSFET 203. However, the change of the bias voltage $V_{bias}$ is unable to be realized in practice, because the operation of the amplifier circuit 310 is extremely sensitive to the change of the bias voltage $V_{bias}$. Accordingly, the bias voltage $V_{bias}$ is usually fixed at a specific value and is unable to be changed from the outside.

In practice, even if the value of the bias voltage $V_{bias}$ is changed within an extremely small range, the operating point of the amplifier circuit 310 readily deviates from its optimum point, resulting in abrupt decrease in gain. This means that the amplifier circuit 310 does not provide the desired amplification operation any more.

Thus, although the gain value of the amplifier circuit 310 can be adjusted from the outside by changing the bias voltage $V_{bias}$ in theory, it is extremely difficult or impossible to be realized in practice.

SUMMARY OF THE INVENTION

Accordingly, an object of the present invention to provide a photoreceiver circuit that makes it possible to adjust readily and optionally the gain value of the photoreceiver circuit.

Another object of the present invention to provide a photoreceiver circuit capable of high-speed operation.

The above objects together with others not specifically mentioned will become clear to those skilled in the art from the following description.

A photoreceiver circuit according to the present invention is comprised of (a) a photoelectric conversion element for converting incident light to a current, (b) an analog voltage amplifier circuit for amplifying a voltage corresponding to the current of the photoelectric conversion element and for producing an amplified voltage as an output of the photoreceiver circuit, and (c) an analog multiplier circuit for multiplying the amplified voltage produced by the voltage amplifier circuit by an adjusting voltage and for producing an output current with a component proportional to a product of the amplified voltage and the adjusting voltage.

The output current of the analog multiplier circuit is supplied to the photoelectric converter element, thereby forming a feedback path of the voltage amplifier circuit.

With the photoreceiver circuit according to the present invention, the analog multiplier circuit is provided between the photoelectric converter element and the analog voltage amplifier circuit to form a feedback path of the voltage amplifier circuit. Therefore, the output (i.e., the amplified voltage) of the voltage amplifier circuit is determined in such a way that the output current of the multiplier circuit is equal to the output current of the photoelectric conversion element.

The analog multiplier circuit multiplies the amplified voltage from the voltage amplifier circuit and the adjusting voltage, thereby producing the output current with the component proportional to the product of the amplified voltage and the adjusting voltage.

Therefore, by changing the value of the adjusting voltage, the value of the output current of the multiplier circuit is changed, in other words, the gain of the photoreceiver circuit can be adjusted readily and optionally.

Moreover, since the voltage corresponding to the current of the photoelectric conversion element scarcely varies, the photoreceiver circuit is capable of high-speed operation.

In a preferred embodiment of the circuit according to the present invention, a voltage-lowering means and a current-leaking means are additionally provided. The voltage-lowering means is connected between the voltage amplifier circuit and the analog multiplier circuit. The current-leaking means is connected in parallel to the voltage-lowering means.

In another preferred embodiment of the circuit according to the present invention, the adjusting voltage is variable from the outside of the photoreceiver circuit.

In still another preferred embodiment of the circuit according to the present invention, the multiplier circuit has a same circuit configuration as that of the Gilbert multiplier circuit. However, any other configuration may be applied to the multiplier circuit if it has a multiplication function of two voltage inputs and produces a current output.

In a further preferred embodiment of the circuit according to the present invention, the current-leaking means has an operation that the amplified voltage of the voltage amplifier circuit is equalized with the output voltage of the photoreceiver circuit after a specific relaxation time has passed. The current-leaking means may have any form if it can realize this operation.

In still further preferred embodiment of the circuit according to the present invention, the voltage-lowering means is a voltage-dividing circuit including capacitors. However, the voltage-lowering means may be any other form if it can lower the amplified voltage.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
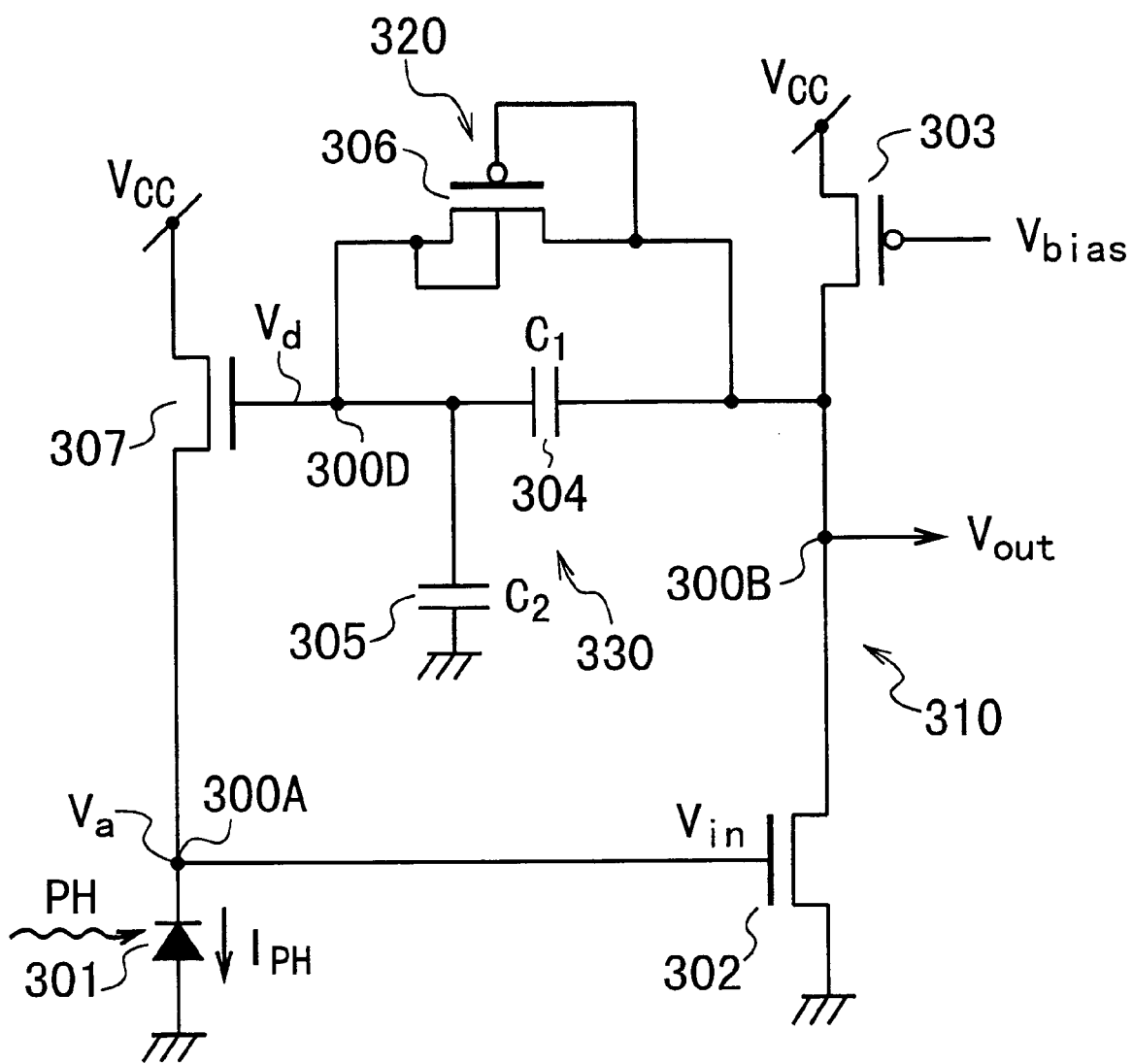
FIG. 1 is a circuit diagram showing a prior-art photoreceiver circuit equipped with an adaptive gain adjusting circuit and a feedback path.
Figure 2:
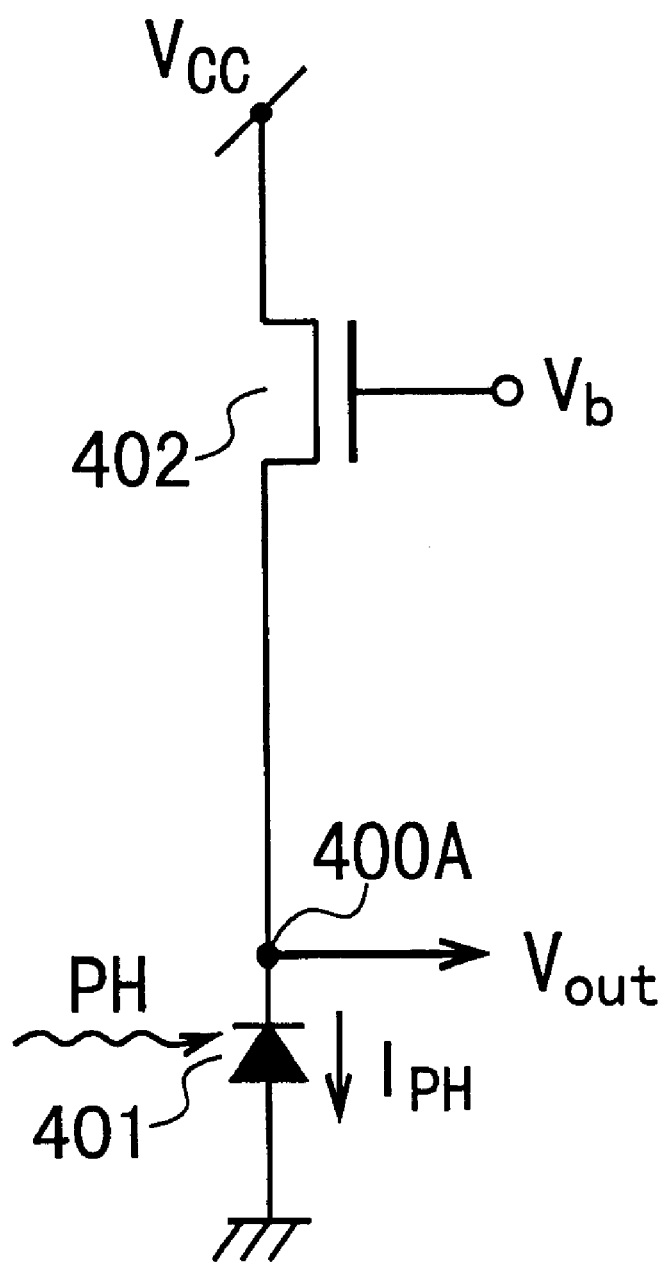
FIG. 2 is a circuit diagram showing a prior-art photoreceiver circuit with a simple configuration, which has only a photodiode and a MOSFET.

Preferred embodiments of the present invention will be described in detail below while referring to the drawings attached.

FIRST EMBODIMENT

A photoreceiver or photoreceptor circuit according to a first embodiment of the present invention is explained below with reference to FIGS. 3 and 4.

Figure 3:
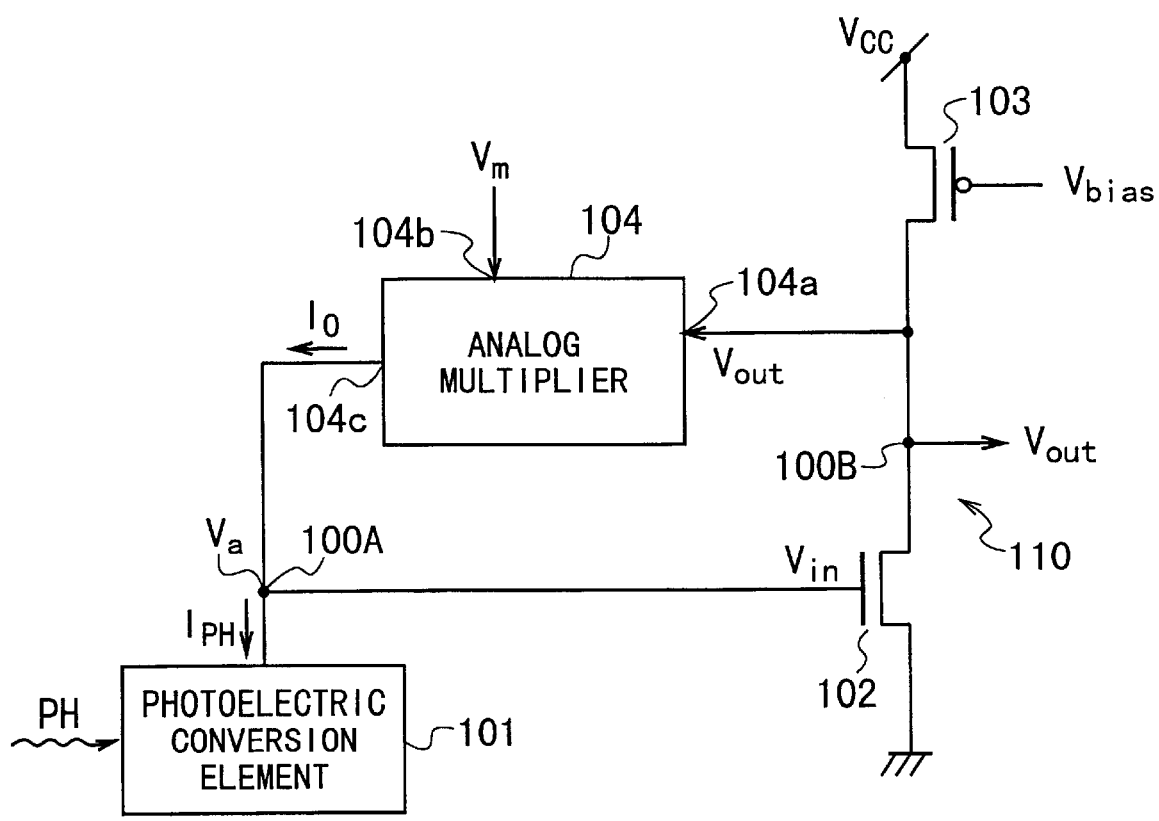
FIG. 3 is a block diagram showing the basic configuration of a photoreceiver circuit according to a first embodiment of the present invention.

FIG. 3 shows the basic configuration of the photoreceiver circuit according to the first embodiment. In FIG. 3, a photoelectric conversion element 101 receives incident light PH and converts it to an electric signal, thereby producing an output current $I_{PH}$. The output current $I_{PH}$ flows through an output terminal 100A of the element 101. The current $I_{PH}$ has a magnitude or amplitude according to the intensity (i.e., illuminance) of the light PH thus received. A voltage $V_a$ with respect to the ground at the terminal 100A is determined by the magnitude of the current $I_{PH}$.

An n-channel MOSFET 102 and a p-channel MOSFET 103 constitute an inverting, analog voltage amplifier circuit 110. The gate of the MOSFET 102 is connected to the output terminal 100A of the photoelectric conversion element 101. The source of the MOSFET 102 is connected to the ground. The drain of the MOSFET 102 is connected to the drain of the p-channel MOSFET 103. The source of the MOSFET 103 is connected to a power supply (not shown) supplying a supply voltage $V_{cc}$. The gate of the MOSFET 103 is applied with a suitable bias voltage $V_{bias}$. This voltage $V_{bias}$ is fixed at a specific value. An output terminal 100B of the photoreceiver circuit is provided at the connection point of the drains of the MOSFETs 102 and 103 in the amplifier circuit 110.

Since the gate of the MOSFET 102 is applied with the voltage $V_a$ at the output terminal 100A of the photoelectric conversion element 101, the voltage $V_a$ is applied to the gate of the MOSFET 102 as an input voltage $V_{in}$ of the amplifier circuit 110, i.e., $V_{in}=V_a$. The amplifier circuit 110 amplifies the input voltage $V_a$ ($=V_{in}$) and outputs an amplified voltage as an output voltage $V_{out}$ at the output terminal 1005.

The n-channel MOSFET 102 is operated in the saturation region, and the p-channel MOSFET 103 serves as a load resistor of the MOSFET 102. This is the same as that of the prior-art photoreceiver circuit shown in FIG. 1.

An analog multiplier circuit 104, which is designed for outputting a current proportional to the product of two input voltages, is provided between the photoelectric conversion element 101 and the voltage amplifier circuit 110, thereby forming a feedback path of the amplifier circuit 110. An input terminal 104a of the multiplier circuit 104 is connected to the output terminal 100B of the photoreceiver circuit and therefore, the output voltage $V_{out}$ is applied to the multiplier circuit 104 as its first input. Another input terminal 104b of the multiplier 104 is used as a gain control terminal for controlling the gain of the photoreceiver circuit according to the first embodiment. To make it possible to adjust optionally the gain of the photoreceiver circuit from the outside, a variable gain-control voltage $V_m$ is applied to the input terminal 104b as its second input. An output terminal 104c of the multiplier circuit 104 is connected to the output terminal 101A of the photoelectric conversion element 101. Therefore, an output current $I_o$ of the multiplier circuit 104 is supplied to the output terminal 100A of the element 101.

The output current $I_o$ of the multiplier circuit 104 has a magnitude proportional to the product of the two input voltages $V_{out}$ and $V_m$. In other words, the current $I_o$ is expressed as $$I_o = A\, V_{out} \cdot V_m \tag{1}$$

where A is a constant. The voltage $V_{out}$ serves as a "multiplicand" of the multiplication operation in the multiplier circuit 104 and the voltage $V_m$ serves as a "multiplier" thereof.

Figure 4:
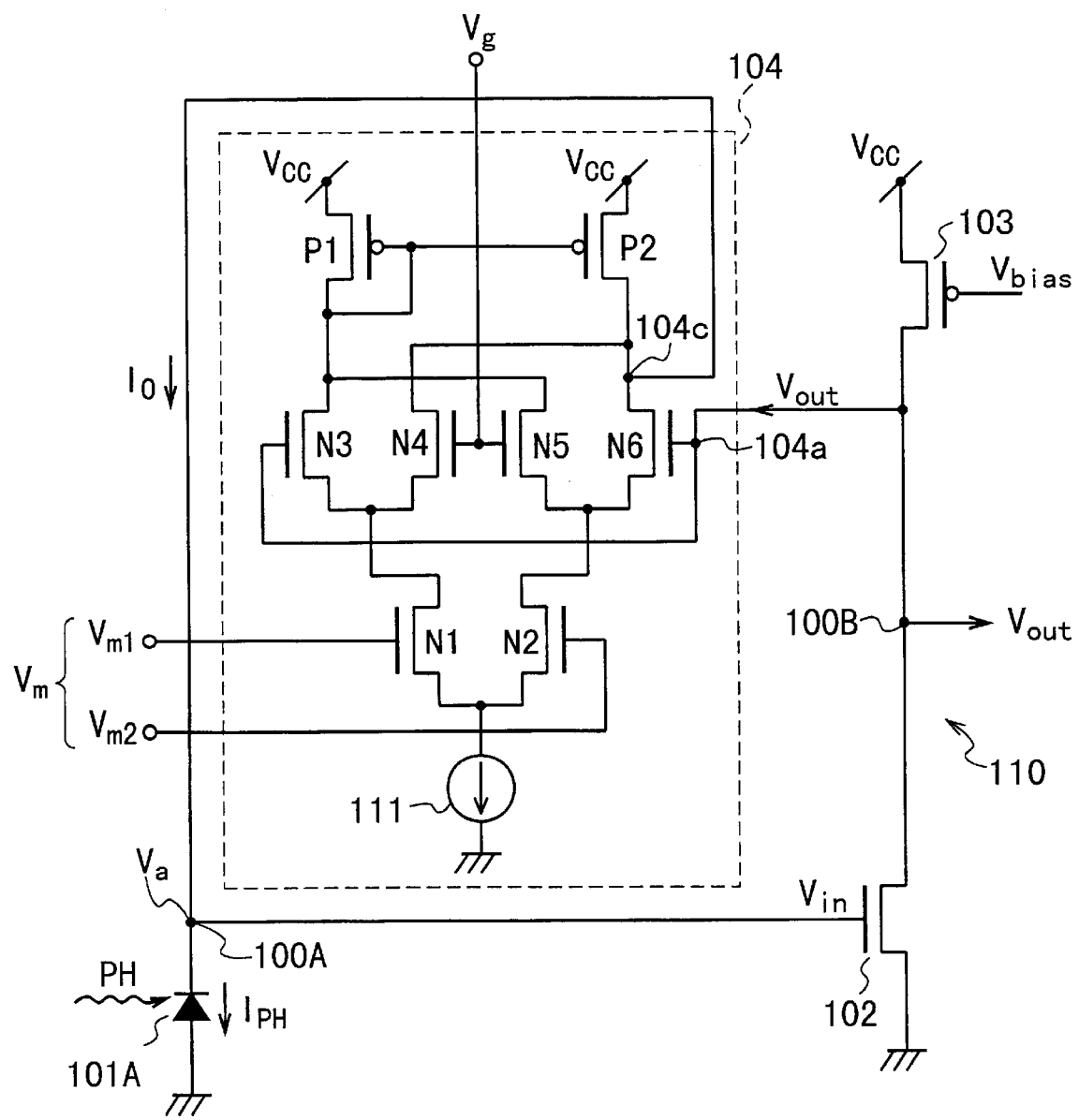
FIG. 4 is a circuit diagram showing a detailed configuration off the photoreceiver circuit according to the first embodiment of FIG. 3.

FIG. 4 shows a detailed configuration of the photoreceiver circuit according to the first embodiment of FIG. 3, in which the multiplier circuit 104 has a same configuration as that of the well-known Gilbert multiplier circuit and at the same time, a photodiode 10A utilizing a p-n junction of a semiconductor material is used as the photoelectric conversion element 101.

As seen from FIG. 4, the Gilbert multiplier circuit is comprised of a differential pair of two source-coupled, n-channel MOSFETs N1 and N2 driven by a constant current sink 111, a differential pair of two source-coupled, n-channel MOSFETs N3 and N4, and a differential pair of two source-coupled, n-channel MOSFETs N5 and N6. The gates of the MOSFETs N1 and N2 are applied with two input voltages $V_{m1}$ and $V_{m2}$, respectively, where $V_{m1}=V_{m2}=V_m$. The coupled sources of the MOSFETs N3 and N4 are connected to the drain of the MOSFET N1. The coupled sources of the MOSFETs N5 and N6 are connected to the drain of the MOSFET N2. The gates of the MOSFETs N3 and N6 are commonly applied with the output voltage $V_{out}$ of the amplifier circuit 110 through the input terminal 104a. The gates of the MOSFETs N4 and N5 are commonly applied with a constant voltage V. through the input terminal 104b. The drains of the MOSFETs N3 and N5 are coupled together. The drains of the MOSFETs N4 and N6 are coupled together.

Two p-channel MOSFETs P1 and P2 constitute a current mirror circuit, which serves as an active load of the Gilbert multiplier circuit. The gate and drain of the MOSFET P1 are coupled together to be connected to the coupled drains of the MOSFETs N3 and N5. The source of the MOSFET P1 is connected to the power supply of $V_{cc}$. The gate of the MOSFET P2 is connected to the gate of the MOSFET 21. The drain of the MOSFET P2 is connected to the coupled drains of the MOSFETs N4 and N6. The source of the MOSFET P2 is connected to the power supply of $V_{cc}$. The output terminal 104c of the multiplier circuit 104, from which its output current $I_o$ is derived, is provided at the connection point of the coupled drains of the MOSFETs N4 and N6 and the drain of the MOSFET P2.

The variable adjusting voltage $V_m$ ($=V_{m1}-V_{m2}$) is differentially applied across the gates of the MOSFETs N1 and N2 and at the same time, the voltage ($V_{out}-V_g$) is differentially applied across the coupled gates of the MOSFETs N3 and N6 and those of the MOSFETs N4 and N5. Thus, the output current $I_o$ is proportional to the product of the voltages $V_m$ and ($V_{out}-V_g$), i.e., $V_m \cdot (V_{out}-V_g)$, resulting in the following equation (2).

$$I_o = A(V_{out}-V_g)(V_{m1}-V_{m2}) = A(V_{out}-V_g)V_m \quad (2)$$

If $V_g=0$ in the equation (2), $I_o=A\ V_m \cdot V_{out}$ is obtained, which is the same as the above-described equation (1).

No further detailed explanation about the Gilbert multiplier circuit is omitted here, because it is well-known. This is disclosed in, for example, the book written by Carver Mead, entitled "ANALOG VLSI AND NEURAL SYSTEMS", and published by ADDISON-WESLEY PUBLISHING COMPANY.

Next, the circuit operation of the photoreceiver circuit according to the first embodiment shown in FIG. 4 is explained below.

The magnitude of the output current $I_{PH}$ of the photodiode 101A is proportional to the intensity of the incident light PH. Also, the output current $I_{PH}$ is kept equal to the output current $I_o$ of the multiplier circuit 104; in other words, the output voltage $V_{out}$ of the photoreceiver circuit, which is applied to the multiplier circuit 104, is determined in such a way that the two currents $I_{PH}$ and $I_o$ are equal to each other. Therefore, if the value of the control voltage $V_m$ ($=V_{m1}-V_{m2}$) is set as positive and small in the above equation (2), the output voltage $V_{out}$ has a comparative large value in order to equalize $I_o$ with $I_{PH}$. On the other hand, if the value of the control voltage $V_m$ is set as positive and large, the output voltage Vout has a small value in order to equalize $I_o$ with $I_{PH}$.

Accordingly, even if the intensity of the incident light PH (i e., the magnitude of the output current $I_o$) is constant, the magnitude of the output voltage $V_{out}$ can be changed. This means that the gain of the voltage amplifier circuit 110 (i.e., the photoreceiver circuit according to the first embodiment) can be readily and optionally adjusted from the outside of the photoreceiver circuit.

Moreover, because of the existence of the feedback path comprising the analog multiplier circuit 104, similar to the prior-art photoreceiver circuit shown in FIG. 1, the voltage $V_a$ at the output terminal 100A of the photo diode 101A (i.e., the input voltage $V_{in}$ of the amplifier circuit 110) is scarcely changed. Thus, the photoreceiver circuit according to the first embodiment of FIG. 4 operates at extremely high speed, which enables the quick response of the photoreceiver circuit to the intensity change of the incident light PH.

SECOND EMBODIMENT

A photoreceiver circuit according to a second embodiment of the present invention is explained below with reference to FIGS. 5 and 6.

Figure 5:
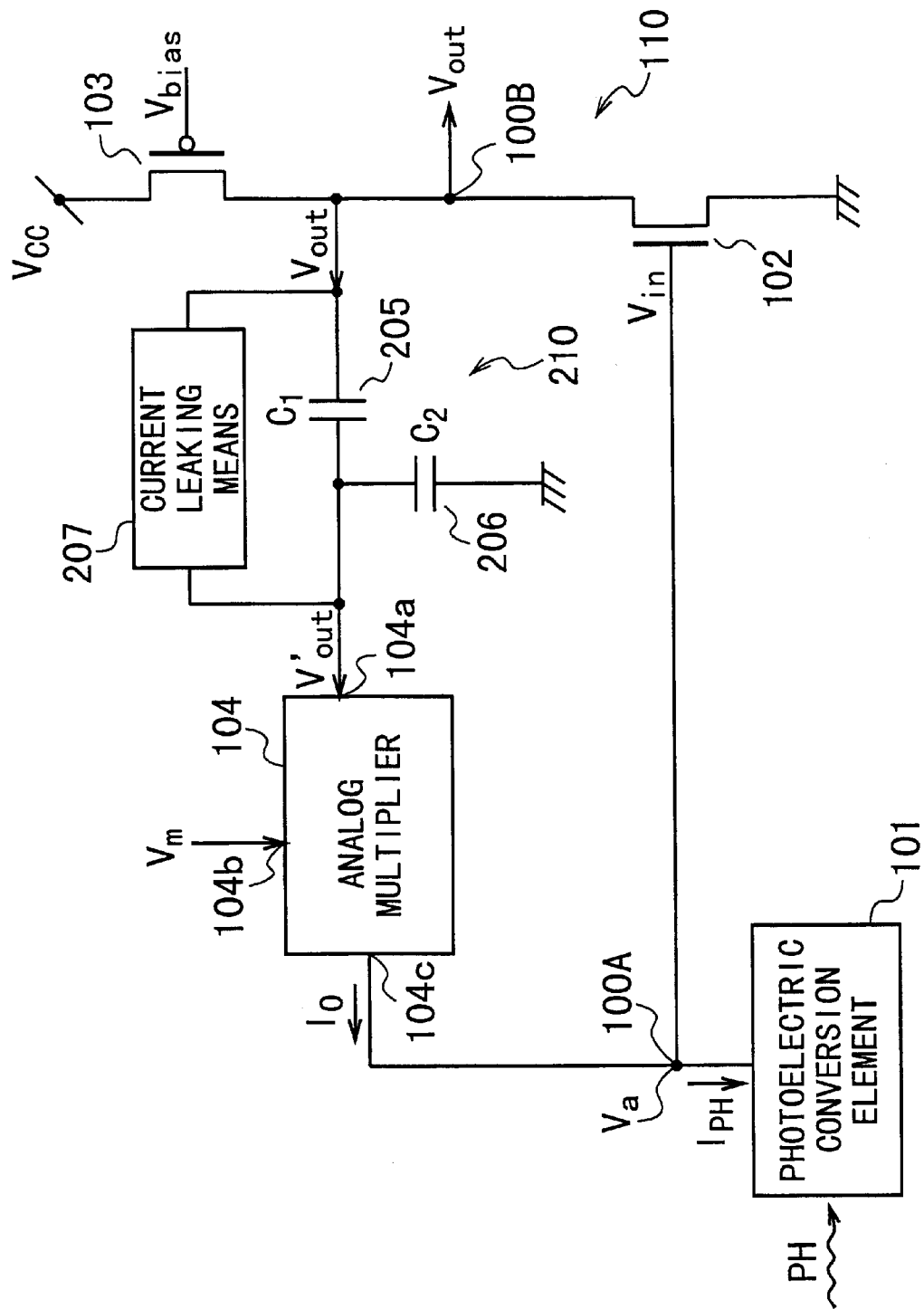
FIG. 5 is a block diagram showing the basic configuration of a photoreceiver circuit according to a second embodiment of the present invention.

FIG. 5 shows the basic configuration of the photoreceiver circuit according to the second embodiment, in which the value of the gain in the changing state where the intensity of the incident light PH varies is different from that in the steady state where the intensity of the light PH is constant.

The photoreceiver circuit according to the second embodiment of FIG. 5 has the same configuration as that of the first embodiment of FIG. 3 other than that a current-leaking means 207 and two capacitors 205 and 206 are additionally provided between the output terminal 100B of the photoreceiver circuit and the input terminal 104a of the analog multiplier circuit 104. Therefore, the explanation about the same configuration is omitted here by attaching the same reference characters as those in the first embodiment of FIG. 3 for the sake of simplification of description.

The capacitor 205, which has a capacitance $C_1$, is connected to the output terminal 100B of the photoreceiver circuit and the input terminal 104a of the multiplier circuit 104. The capacitor 206, which has a capacitance $C_2$, is connected to the input terminal 104a and the ground. The two capacitors 205 and 206 constitute a voltage-lowering means 210 for lowering the output voltage $V_{out}$ of the photoreceiver circuit to a specific voltage, producing a lowered (or divided) output voltage $V_{out}'$. This voltage $V_{out}'$ is applied to the input terminal 105a.

The current-leaking means 207 has the following operation When a potential difference or voltage is generated between the output terminal 100B and the input terminal 104a, the current leaking means 207 allows a small current to gradually flow (i.e., leak) from the output terminal 100B to the input terminal 104a and vice versa. Thus, the potential difference or voltage between the terminals 100B and 104a disappears, resulting in $V_{out}'=V_{out}$, after a specific relaxation time has passed.

Figure 6:
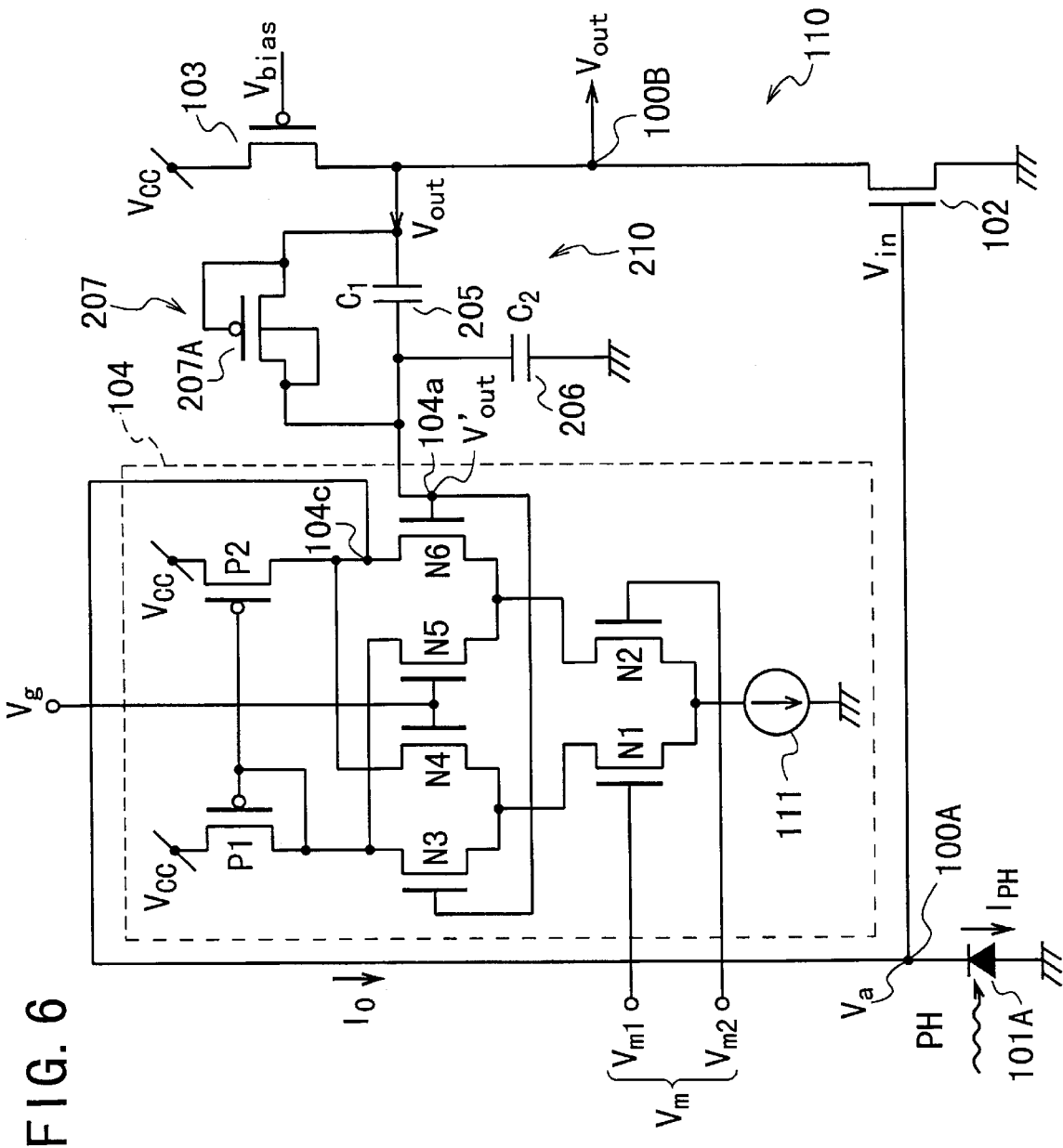
FIG. 6 is a circuit diagram showing a detailed configuration of the photoreceiver circuit according to the second embodiment of FIG. 5.

FIG. 6 shows a detailed configuration of the photoreceiver circuit according to the second embodiment of FIG. 5, in which the multiplier circuit 104 has a same configuration as that of the well-known Gilbert multiplier circuit, a photo diode 101A is used as the photoelectric conversion element 101, and a p-channel MOSFET 207A is used as the current-leaking means 207.

The gate and the drain of the MOSFET 201A are coupled together to be connected to the output terminal 100B of the photoreceiver circuit. The source of the MOSFET 207A, which is connected to the substrate, is connected to the input terminal 104a of the multiplier circuit 104. The capacitor 205 is connected in parallel to the MOSFET 207A.

Next, the circuit operation of the photoreceiver circuit according to the second embodiment shown in FIG. 6 is explained below.

When the incident light PH applied to the photodiode 101A has a constant intensity with time, i.e., the photoreceiver circuit is in the steady state, the electric potentials at the output terminal 100B and the input terminal 104a are kept equal to each other (i.e., $V_{out}'=V_{out}$) because of the operation of the current-leaking means 207 (i.e., the MOSFET 207A). Therefore, because of the same reason as that shown in the first embodiment, the value of the gain of the photoreceiver circuit can be changed by adjusting the value of the adjusting voltage $V_m(=V_{m1}-V_2)$ even if the intensity of the incident light PH is not changed. Thus, the gain of the photoreceiver circuit according to the second embodiment can be adjusted readily and optionally from the outside of the photoreceiver circuit.

When the incident light PH applied to the photodiode 101A varies with time, i.e., the photoreceiver circuit is in the changing state, the current $I_{PH}$ of the photodiode 101A varies according to the intensity change of the light PR, thereby causing change of the voltage $V_a$ at the output terminal 100A. When a small change of the voltage $V_a$ occurs at the terminal 100A, it is amplified by the voltage amplifier circuit 110 to produce a large change in the output voltage $V_{out}$. The large change in the output voltage $V_{out}$ is sent to the input terminal 100a of the multiplier circuit 104 through the voltage-lowering means 210 comprising the capacitors 205 and 206.

The output voltage $V_{out}$ is lowered by the voltage-lowering means 210 to she lowered voltage $V_{out}'$. Here, the output voltage $V_{out}$ is divided by the capacitors 205 and 206 to produce the lowered voltage $V_{out}'$ given as $V_{out}'=[C_1/(C_1+C_2)] V_{out}$. This is because the current-leaking operation of the current-leaking means 207 is carried out very slowly. Thus, to equalize the output current $I_o$ of the multiplier circuit 104 with the outout current $I_{PH}$ of the photodiode 101A, the output voltage $V_{out}$ of the amplifier circuit 110 in the changing state needs to have a value higher than that necessitating in the steady state. This means that the gain of the amplifier circuit 110 or the photoreceiver circuit in the changing state has a value greater than that in the steady state.

When the intensity change of the incident light PH ceases after a specific time period (i.e., the relaxation time) has passed, the voltage $V_{out}'$ at the input terminal 104a becomes equal to the voltage $V_{out}$ at the output terminal 100B because of the current-leaking operation of the current-leaking means 207. In other words, the lowered output voltage $V_{out}'$ becomes equal to the original output voltage $V_{out}$, i.e., $V_{out}'=V_{out}$.

As a result, the value of the gain in the changing state is $[(C_1+C_2)/C_1]$ times as much as that in the steady state. This may be explained in the following way.

In the changing state, the feedback path of the amplifier circuit 110 is formed by the capacitors 205 and 206 of the voltage-lowering means 210 and the multiplier circuit 104. Therefore, the divided voltage $V_{out}'=[C_1/(C_1+C_2)] V_{out}$ is applied to the multiplier circuit 104. On the other hand, in the steady state, the feedback path of the amplifier circuit 110 is formed by the MOSFET 207A of the current-leaking means 207 and the multiplier circuit 104. Therefore, the original output voltage $V_{out}$ is directly applied to the multiplier circuit 104.

Moreover, because of the existence of the feedback loop comprising the analog multiplier circuit 104, similar to the prior-art photoreceiver circuit shown in FIG. 1, the voltage $V_a$ at the output terminal 100A of the photodiode 101A (i.e., the input voltage $V_{in}$ of the amplifier circuit 110) is scarcely changed. Thus, the photoreceiver circuit according to the second embodiment of FIG. 6 operates at extremely high speed, in other words, it is capable of quick response to the intensity change of the incident light PH.

In the above-described second embodiment, the current-leaking means 207 is formed by the p-channel MOSFET 207 and the voltage-lowering means 210 is formed by the capacitors 205 and 206. However, the current-leaking means 207 maybe formed by any other device/devices or a circuit if it has the current-leaking function described above. Also, the voltage-lowering means 210 may be formed by any other device/devices or a circuit if it has the voltage-lowering function described above.

Additionally, in the above-described first and second embodiments, the analog multiplier circuit 104 has a same configuration as that of the well-known Gilbert multiplier circuit. However, any other configuration may be applied to the multiplier circuit 104 if it has a multiplication function of two voltage inputs and produces a current output.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A photoreceiver circuit comprising:
   (a) a photoelectric conversion element for converting incident light to a current;
   (b) an analog voltage amplifier circuit for amplifying a voltage corresponding to said current of said photoelectric conversion element and for producing an amplified voltage as an outout of said photoreceiver circuit; and
   (c) an analog multiplier circuit for multiplying said amplified voltage produced by said voltage amplifier circuit by an adjusting voltage and for producing an output current with a component proportional to a product of said amplified voltage and said adjusting voltage;
   wherein said output current of said analog multiplier circuit is supplied to said photoelectric converter element, thereby forming a feedback path of said voltage amplifier circuit.

2. A photoreceiver circuit comprising:
   a photoelectric conversion element for converting incident light to a current;
   an analog voltage amplifier circuit for amplifying a voltage corresponding to said current of said photoelectric conversion element and for producing an amplified voltage as an output of said photoreceiver circuit;
   an analog multiplier circuit for multiplying said amplified voltage produced by said amplifier circuit by an adjusting voltage and for producing an output current with a component proportional to a product of said amplified voltage and said adjusting voltage;

wherein said output current of said analog multiplier circuit is supplied to said photoelectric converter element, thereby forming a feedback path of said voltage amplifier circuit; and a voltage-lowering means and a current-leaking means, wherein said voltage-lowering means is connected between said voltage amplifier circuit and said analog multiplier circuit, and said current-leaking means is connected in parallel to said voltage-lowering means.

3. The circuit as claimed in claim 1, wherein said adjusting voltage is variable from the outside of said photoreceiver circuit.

4. The circuit as claimed in claim 1, wherein said multiplier circuit has a same circuit configuration as that of the Gilbert multiplier circuit.

5. The circuit as claimed in claim 2, wherein said current-leaking means has an operation that said amplified voltage of said voltage amplifier circuit is equalized with said output voltage of said photoreceiver circuit after a specific relaxation time has passed.

6. The circuit as claimed in claim 2, wherein said voltage-lowering means is a voltage-dividing circuit including capacitors.

* * * * *